US012787650B2

(12) United States Patent
Tsuburaoka et al.

(10) Patent No.: US 12,787,650 B2
(45) Date of Patent: Nov. 3, 2026

(54) PIEZOELECTRIC FILM, METHOD OF PRODUCING PIEZOELECTRIC FILM, PIEZOELECTRIC ELEMENT, AND PIEZOELECTRIC DEVICE

(71) Applicant: NITTO DENKO CORPORATION, Ibaraki (JP)

(72) Inventors: Gaku Tsuburaoka, Ibaraki (JP); Daisuke Nakamura, Ibaraki (JP); Taketo Ishikawa, Ibaraki (JP); Hironobu Machinaga, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 613 days.

(21) Appl. No.: 18/283,607

(22) PCT Filed: Mar. 28, 2022

(86) PCT No.: PCT/JP2022/015069

§ 371 (c)(1),
(2) Date: Sep. 22, 2023

(87) PCT Pub. No.: WO2022/210563

PCT Pub. Date: Oct. 6, 2022

(65) Prior Publication Data

US 2024/0172564 A1 May 23, 2024

(30) Foreign Application Priority Data

Mar. 30, 2021 (JP) ................................ 2021-056823
Sep. 28, 2021 (JP) ................................ 2021-158022
Mar. 23, 2022 (JP) ................................ 2022-046696

(51) Int. Cl.
*H10N 30/00* (2023.01)
*C04B 35/453* (2006.01)
(Continued)

(52) U.S. Cl.
CPC ......... *H10N 30/853* (2023.02); *C04B 35/453* (2013.01); *C30B 23/08* (2013.01);
(Continued)

(58) Field of Classification Search
CPC .. H10N 30/853; H10N 30/076; H10N 30/079; C04B 35/453; C04B 2235/3206;
(Continued)

(56) References Cited

U.S. PATENT DOCUMENTS 11,411,164 B2 8/2022 Kimura et al.
12,101,076 B2 * 9/2024 Hill .......................... H03H 3/02
(Continued)

FOREIGN PATENT DOCUMENTS

CN 110462860 A 11/2019
CN 111244263 A 6/2020
(Continued)

OTHER PUBLICATIONS

International Search Report issued for corresponding International Patent Application No. PCT/JP2022/015069 on Jun. 21, 2022, along with an English translation (7 pages).
(Continued)

*Primary Examiner* — Julio C. Gonzalez
(74) *Attorney, Agent, or Firm* — Hauptman Ham, LLP

(57) ABSTRACT

A piezoelectric film contains a piezoelectric material having a wurtzite-type crystal structure as a main component, and an additive element containing Kr, wherein the piezoelectric material contains a component selected from the group consisting of Zn, Al, Ga, Cd, and Si, as an electropositive element, and wherein a ratio of a content of Kr element to a content of contained elements in the piezoelectric material is in a range from 0.01 atm % to 0.05 atm %.

8 Claims, 6 Drawing Sheets

(51) Int. Cl.

| | |
|---|---|
| ***C30B 23/08*** | (2006.01) |
| ***C30B 25/06*** | (2006.01) |
| ***C30B 29/16*** | (2006.01) |
| ***H10N 30/076*** | (2023.01) |
| ***H10N 30/853*** | (2023.01) |

(52) U.S. Cl.
CPC .............. *C30B 25/06* (2013.01); *C30B 29/16* (2013.01); *H10N 30/076* (2023.02); *C04B 2235/3206* (2013.01); *C04B 2235/3284* (2013.01); *C04B 2235/46* (2013.01); *C04B 2235/762* (2013.01); *C04B 2235/95* (2013.01)

(58) Field of Classification Search
CPC ........ C04B 2235/3284; C04B 2235/46; C04B 2235/762; C04B 2235/95; C04B 2235/77; C04B 35/62218; C30B 23/08; C30B 25/06; C30B 29/16; C30B 23/02; C23C 14/3414; C23C 14/08; C23C 14/34
See application file for complete search history.

(56) References Cited

U.S. PATENT DOCUMENTS

| | | | | |
|---|---|---|---|---|
| 2005/0218756 | A1* | 10/2005 | Fujii | B41J 2/1632 310/358 |
| 2007/0057285 | A1 | 3/2007 | Akiyama et al. | |
| 2020/0176667 | A1 | 6/2020 | Kimura et al. | |
| 2020/0274051 | A1 | 8/2020 | Kimura | |
| 2020/0274052 | A1 | 8/2020 | Kimura | |
| 2020/0381610 | A1 | 12/2020 | Arimoto et al. | |
| 2021/0399202 | A1 | 12/2021 | Nagaoka et al. | |
| 2022/0037580 | A1 | 2/2022 | Nakamura et al. | |

FOREIGN PATENT DOCUMENTS

| | | | |
|---|---|---|---|
| JP | 2005-351664 | A | 12/2005 |
| JP | 2008-42069 | A | 2/2008 |
| JP | 2013-4707 | A | 1/2013 |
| JP | 2020-88281 | A | 6/2020 |
| TW | 201916415 | A | 4/2019 |
| TW | 201918565 | A | 5/2019 |
| WO | 2004/101842 | A1 | 11/2004 |
| WO | 2020/049880 | A1 | 3/2020 |
| WO | 2020/066930 | A1 | 4/2020 |
| WO | 2020/067330 | A1 | 4/2020 |

OTHER PUBLICATIONS

Written Opinion issued for corresponding International Patent Application PCT/JP2022/015069 on Jun. 21, 2022 (4 pages).

Minju Ying et al., “Extremely large do magnetism in krypton implanted polar ZnO films”, Journal of Materials Chemistry C, 2019, vol. 7, No. 5, pp. 1138-1145.

Office Action dated Jul. 31, 2025, for corresponding Taiwanese Patent Application No. 111111828, along with an English translation (7 pages).

Office Action issued on Jun. 24, 2026 for corresponding Chinese Patent Application No. 202280022562.9, along with an English machine translation (9 pages).

* cited by examiner

PIEZOELECTRIC FILM, METHOD OF PRODUCING PIEZOELECTRIC FILM, PIEZOELECTRIC ELEMENT, AND PIEZOELECTRIC DEVICE

CROSS REFERENCE TO RELATED APPLICATION

This application is a National Stage of International Application No. PCT/JP2022/015069, filed on Mar. 28, 2022, which designates the United States and was published in Japan, and which is based upon and claims priority to Japanese Patent Application Nos. 1) 2021-056823, filed on Mar. 30, 2021; 2) 2021-158022, filed on Sep. 28, 2021; and 3) 2022-046696, filed on Mar. 23, 2022 in the Japan Patent Office. All of the aforementioned applications are hereby incorporated by reference in their entireties.

TECHNICAL FIELD

The present invention relates to a piezoelectric film, a method of producing the piezoelectric film, a piezoelectric element, and a piezoelectric device.

BACKGROUND OF THE INVENTION

Since piezoelectric films have high piezoelectricity, a piezoelectric element with a piezoelectric film is widely used for, for example, a sensor such as a pressure sensor, an acceleration sensor, a high-frequency filter device, and a piezoelectric actuator.

When a piezoelectric film is formed by growing crystals on a substrate or the like, the crystals of the piezoelectric film are oriented in the c-axis direction, so that the piezoelectric film can be easily deflected due to the increased film stress although the piezoelectric film has high piezoelectricity properties. Therefore, if the substrate on which the piezoelectric film is placed is a low-rigidity substrate such as PET, the laminate on which the piezoelectric film is placed on the substrate warps, and if the warping is too strong, the laminate deforms into a cylindrical shape. On the other hand, if the substrate is a high-rigidity substrate such as a Si substrate or a glass substrate, cracks occur in the piezoelectric film and peeling between the substrate and the piezoelectric layer tends to occur, which adversely affects the piezoelectric properties of the piezoelectric element when the laminate is used for the piezoelectric element.

Therefore, various methods have been investigated to suppress the film stress of the piezoelectric film while making the piezoelectric film highly oriented, and a piezoelectric element in which a stress control layer is arranged between the substrate and the piezoelectric film has been proposed.

As such a piezoelectric element, for example, a piezoelectric element having a bottom electrode layer, an orientation control layer, a piezoelectric layer, and an upper electrode layer laminated in this order on a substrate is disclosed (for example, Patent Document 1).

RELATED-ART DOCUMENT

Patent Documents

[Patent document 1] Japanese Patent Application Laid-Open Publication No. 2008-42069

SUMMARY OF INVENTION

Problem to be Solved by the Invention

However, since conventional piezoelectric elements have an orientation control layer between a lower electrode layer and a piezoelectric layer, there is a problem that a lattice matching between the lower electrode layer and the piezoelectric layer is easily broken by the influence of the orientation control layer. When the lattice matching is broken, the crystal orientation of the piezoelectric layer is disturbed, and it becomes difficult to make the piezoelectric layer highly oriented, which lowers the piezoelectric properties. Since the operating principle of the piezoelectric element is the vibration in the thickness direction (thickness vibration) of the piezoelectric layer, in order for the piezoelectric layer to exhibit high piezoelectric properties, it is required that the piezoelectric layer has a high crystal orientation with the crystal orientation being oriented in the same direction.

Furthermore, since the orientation control layer itself has a film stress, the film stress by the orientation control layer acts on the lower electrode layer located below the orientation control layer, which causes delamination between the lower electrode layer and the orientation control layer, cracking of the lower electrode layer, warping of the substrate, or the like, thereby lowering the device properties of the piezoelectric element.

One aspect of the present invention is to provide a piezoelectric film that can exhibit excellent piezoelectric properties and reduce film stress.

Means for Solving Problems

One aspect of the piezoelectric film according to the present invention provides a piezoelectric material having a wurtzite-type crystal structure as a main component; and an additive element containing Kr, wherein the piezoelectric material contains a component selected from the group consisting of Zn, Al, Ga, Cd, and Si as an electropositive element, and wherein a ratio of a content of Kr element to a content of the contained elements in the piezoelectric material is in a range from 0.01 atm % to 0.05 atm %.

One aspect of a method of producing the piezoelectric film according to the present invention is a method of producing the piezoelectric film described above, in which the piezoelectric film is formed by sputtering the piezoelectric material on a substrate and by containing Kr into the substrate, by a sputtering method using a target containing Zn under a mixed gas atmosphere containing Kr and oxygen.

One aspect of the piezoelectric element according to the present invention includes an electrode and a piezoelectric layer on a substrate, and the piezoelectric layer is the piezoelectric film described above.

Effects of the Invention

One aspect of the piezoelectric film according to the present invention can exhibit excellent piezoelectric properties and reduce film stress.

DETAILED DESCRIPTION OF THE INVENTION

Figure 1:
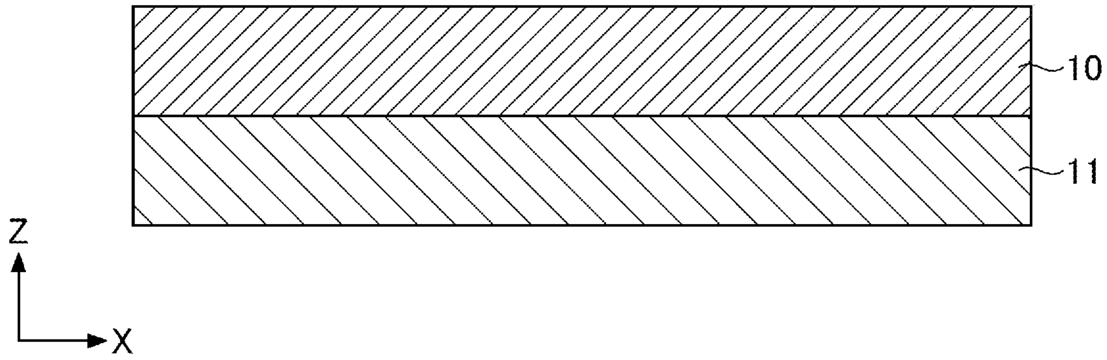
FIG. 1 is a schematic cross-sectional view illustrating a configuration of a piezoelectric film according to an embodiment of the present invention.

Hereafter, the embodiments of carrying out the present invention will be described in detail. In order to facilitate the understanding of the explanation, identical components in each drawing will be denoted by identical symbols, and overlapping explanations will be omitted. In addition, the scale of each component in the drawing may be different from the actual scale. In the present specification, "to" denoting a numerical range means, unless otherwise stated, that the numerical values listed before and after "to" are included as the lower and upper limits.

<Piezoelectric Film>

A piezoelectric film according to an embodiment of the present invention will be described. FIG. 1 is a schematic cross-sectional view illustrating the configuration of the piezoelectric film according to the present embodiment. As illustrated in FIG. 1, a piezoelectric film 10 according to the present embodiment contains a piezoelectric material (wurtzite-type crystal material) having a wurtzite-type crystal structure as a main component and a kind of component selected from the group consisting of Ar, Kr, Xe, and Rn as an additive element. The piezoelectric film 10 can be used for the piezoelectric element by being provided on a substrate 11, for example.

In the present specification, the thickness direction (vertical direction) of the piezoelectric film 10 is defined as the Z-axis direction, and the transverse direction (horizontal direction) perpendicular to the thickness direction is defined as the X-axis direction. The direction opposite to the substrate 11 side in the Z-axis direction is defined as the +Z-axis direction, and the substrate 11 side is defined as the −Z-axis direction. In the following explanation, for convenience of explanation, the +Z-axis direction is referred to as above or upward, and the −Z-axis direction is referred to as below or downward. However, these do not represent a universal vertical relationship.

The main component means that the content of the piezoelectric material is 95 atm % or more, preferably 98 atm % or more, and more preferably 99 atm % or more.

The substrate 11 is the substrate on which the piezoelectric film 10 is provided. Any material can be used as the substrate 11, and a plastic substrate, a silicon (Si) substrate, a glass substrate, or the like can be used.

When a plastic substrate is used, a flexible material that can provide flexibility to the piezoelectric element with the piezoelectric film 10 is preferably used.

Examples of the materials that form plastic substrates include polyethylene terephthalate (PET), polyethylene naphthalate (PEN), polycarbonate (PC), acrylic resin, cycloolefin polymer, polyimide (PI), or the like. Among these materials, PET, PEN, PC, acrylic resin, and cycloolefin polymer are colorless and transparent materials, and are suitable when transparent electrodes are used for the piezoelectric element equipped with the piezoelectric film 10. In addition, when light transmission is not required for the piezoelectric element equipped with the piezoelectric film 10, as in health care products such as a pulsometer and a heart rate meter, or an in-vehicle pressure sensing sheet, the above materials or translucent or opaque plastic materials may be used for the material forming the plastic substrate.

The thickness of the substrate 11 is not particularly limited, and can be adjusted as desired according to the application of the piezoelectric film 10, the material of the substrate 11, or the like. For example, if the substrate 11 is a plastic substrate, the thickness of the substrate 11 is in a range from 1 μm to 250 μm. The measurement method of the thickness of the substrate 11 is not particularly limited, and any measurement method can be used.

As described above, the piezoelectric film 10 contains wurtzite-type crystalline material as a main component.

The wurtzite-type crystalline structure of the piezoelectric material is represented by the general formula AB (A is an electropositive element and B is an electronegative element). The wurtzite-type crystalline material has a hexagonal unit lattice and a polarization vector in the direction parallel to the c-axis.

The wurtzite-type crystalline material preferably uses a material that exhibits piezoelectric properties above a certain value and can be crystallized in a low-temperature process below 200° C. The wurtzite-type crystalline material contains a kind of component selected from the group consisting of Zn, Al, Ga, Cd, and Si as an electropositive element A represented by the general formula AB. As the wurtzite crystal material, for example, zinc oxide (ZnO), zinc sulfide (ZnS), zinc selenide (ZnSe), zinc telluride (ZnTe), aluminum nitride (AlN), gallium nitride (GaN), cadmium selenide (CdSe), cadmium telluride (CdTe), silicon carbide (SiC), and the like can be used. Among these, ZnO is preferably used as the wurtzite-type crystal material. One of these may be used alone, or two or more may be used in combination. When two or more wurtzite-type crystal materials are used in combination, one or more of these components may be included as the main component, and other components may be included as optional components.

The wurtzite-type crystal material contains ZnO, preferably being composed substantially of ZnO, and more preferably only of ZnO. "Substantially" means that, in addition to ZnO, unavoidable impurities that can be unavoidably included in the production process may be included.

Figure 2:
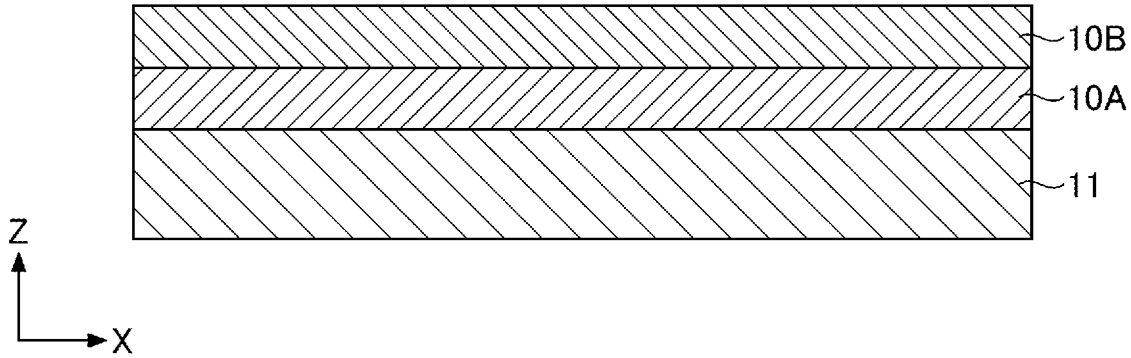
FIG. 2 is a schematic cross-sectional view illustrating an example of another configuration of a piezoelectric film.

When two or more wurtzite-type crystalline materials are used in combination, the respective piezoelectric films may be laminated. For example, as illustrated in FIG. 2, piezoelectric films 10A and 10B may be laminated on the substrate 11 in this order.

The wurtzite-type crystal material may contain alkaline earth metals such as Mg, Ca, Sr, or the like; or metals such as vanadium (V), titanium (Ti), zirconium (Zr), silica (Si), lithium (Li), or the like, in addition to the above mentioned ZnO, ZnS, ZnSe, and ZnTe, in a specified range of proportions. These components may be contained in an elemental state or in an oxide state. For example, if the wurtzite-type crystalline material contains Mg in addition to ZnO or the like, Mg can be contained as MgO. These components can distort the crystal lattice of ZnO by entering the Zn site of ZnO or the like, thus improving the piezoelectric properties.

The piezoelectric film 10 contains additive elements as described above. As the additive elements, Ar, Kr, Xe, Rn, or the like can be used. These may be used alone or used two or more in combination.

The ratio of the content of Kr element to the content of contained elements in the piezoelectric material (the content of Kr element (Kr element/contained elements)) is in a range from 0.01 atm % to 0.05 atm %, preferably in a range from 0.01 atm % to 0.04 atm %, and more preferably in a range from 0.01 atm % to 0.03 atm %. When the content of Kr element is 0.01 atm % or more, the effect of the addition of the contained elements in the piezoelectric material can be exerted, so that the c-axis orientation of the piezoelectric material can be enhanced and the increase in film stress can be suppressed. In addition, when the content of Kr element is 0.05 atm % or less, the increase in the oblique component of the sputtered particles reaching the substrate 11 can be suppressed under the sputtering film formation conditions, so that the decrease in the crystal orientation of the piezoelectric material can be suppressed.

The contained elements include all the elements contained in the piezoelectric material.

The contained elements of "the ratio of the content of Kr element (Kr element/contained elements)" means the total amount of the contained elements. For example, when the contained elements in the piezoelectric material is only ZnO, it means that the content of the piezoelectric material is only ZnO, and when the contained elements in the piezoelectric material contain $Al_2O_3$ and the like, in addition to ZnO, it means the total content of ZnO, $Al_2O_3$, and the like.

The content of the additive element such as Kr or the like and the contained elements in the piezoelectric film 10 can be measured by, for example, Rutherford Backscattering Spectrometry (RBS) using Pelletron 3SDH and 5SDH-2 (manufactured by NEC) as measuring devices.

The thickness of the piezoelectric film 10 is preferably in a range from 100 nm to 3000 nm, more preferably in a range from 200 nm to 2000 nm, and more preferably in a range from 300 nm to 1000 nm. If the thickness of the piezoelectric film 10 is 100 nm or more, even if the orientation control layer is provided below the piezoelectric film 10 when the piezoelectric film 10 is applied to the piezoelectric element, the piezoelectric film 10 can have sufficient piezoelectric properties, that is, polarization properties proportional to pressure. If the thickness of the piezoelectric film 10 is 3000 nm or less, even if the piezoelectric film 10 contains the above-mentioned additive elements, the generation of cracks or the like in the piezoelectric film 10 can be reduced, and leak paths between electrodes can be suppressed, so that the piezoelectric film 10 can stably exhibit piezoelectric properties.

In addition, as described above, when the piezoelectric film 10 contains wurtzite-type crystalline material as a main component and the wurtzite-type crystalline material contains Kr among Ar, Kr, Xe, and Rn as additive elements, the degree of crystal orientation is preferably 5° or less and the film density is preferably 5.1 g/cm 3 or less. The wurtzite-type crystalline material may be composed substantially of ZnO or only of ZnO.

The piezoelectric film 10 is provided with the wurtzite-type crystalline material containing ZnO as the main component, and if the degree of crystal orientation and the film density are respectively below the above upper limit values, the c-axis orientation of the piezoelectric material becomes high and the increase in the film stress is suppressed.

The degree of crystal orientation is preferably 5° or less, more preferably 2.8° or less, and more preferably 2.5° or less. If the degree of crystal orientation is 5° or less, the c-axis orientation of the piezoelectric material contained in the piezoelectric film 10 is favorable, and the energy conversion efficiency can be enhanced, so that the piezoelectric properties of the piezoelectric film 10 can be enhanced. In particular, ZnO has the wurtzite-type crystal structure, and the correlation between the degree of crystal orientation and the piezoelectric properties is higher than that of piezoelectric materials with other crystal structures. Therefore, if the degree of crystal orientation of ZnO is 5° or less, the energy conversion efficiency is likely to be higher. Therefore, when the piezoelectric film 10 is applied to the piezoelectric element, the piezoelectric properties of the piezoelectric element can be improved.

The degree of crystal orientation is indicated by the Full Width at Half Maximum (FWHM) obtained when the surface of the piezoelectric film 10 is measured by the X-ray Rocking Curve (XRC) method. That is, the degree of crystal orientation is indicated by the FWHM of the peak waveform of the rocking curve obtained when the reflection from the (0002) plane of the crystal of ZnO that is the main component contained in the piezoelectric film 10, is measured by the XRC method. Since ZnO contained in the piezoelectric film 10 has the wurtzite-type crystal structure, the FWHM indicates the degree of parallelism of the c-axis alignment of the crystals constituting the piezoelectric material. Therefore, the FWHM of the peak waveform of the rocking curve obtained by the XRC method is an index of the c-axis orientation of the piezoelectric film 10. Therefore, the smaller the FWHM of the rocking curve, it can be evaluated that the better the crystal orientation of the piezoelectric film 10 in the c-axis direction.

Figure 3:
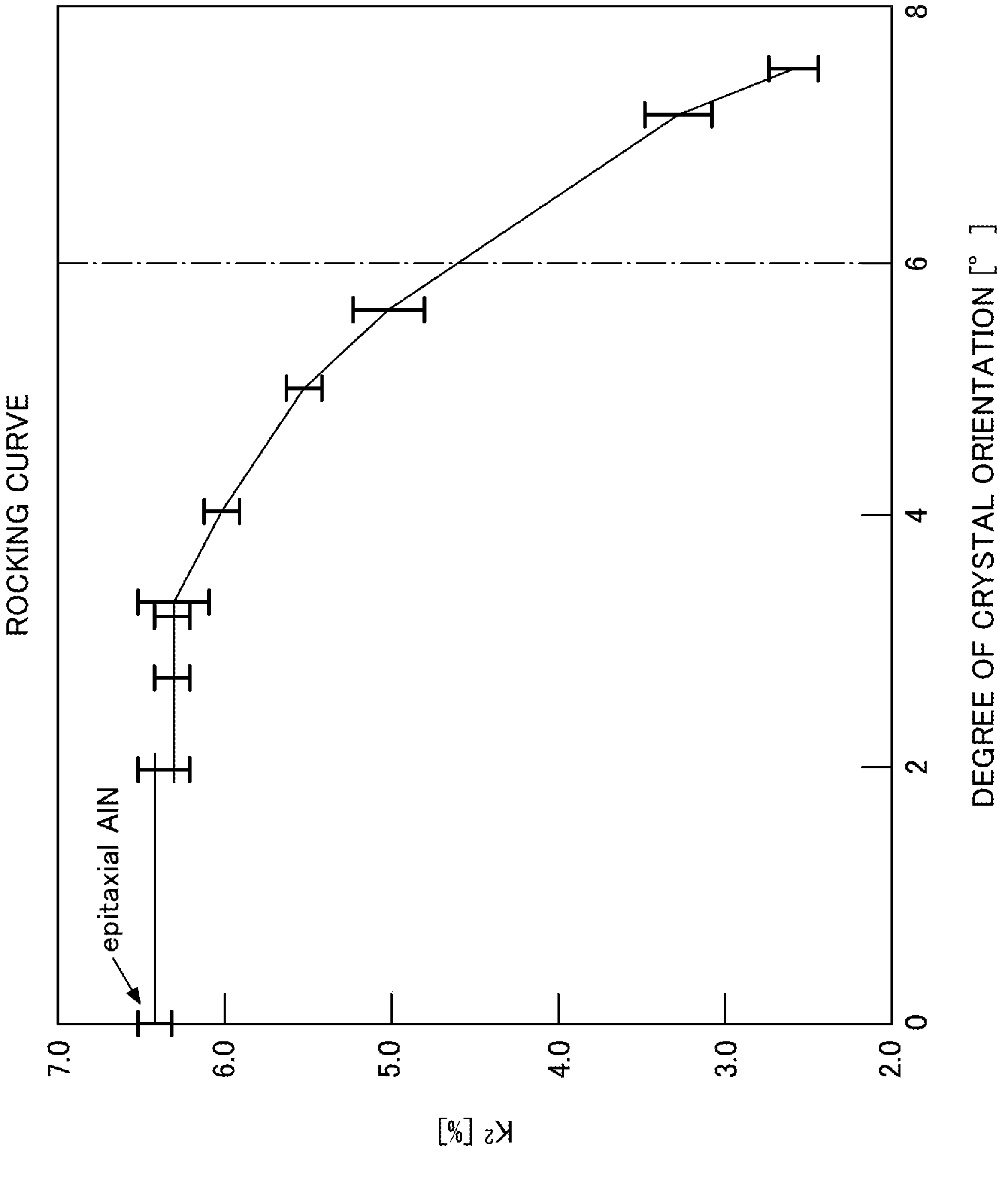
FIG. 3 is a view illustrating an example of a relationship between a degree of crystal orientation and an electromechanical coupling coefficient.

FIG. 3 illustrates an example of the relationship between the degree of crystal orientation and the electromechanical coupling factor K. FIG. 3 indicates the relationship between the degree of crystal orientation of AlN and the electromechanical coupling factor K. In FIG. 3, the horizontal axis is the degree of crystal orientation and the vertical axis is the square value ($K^2$ value) of the electromechanical coupling constant K. FIG. 3 also indicates the relationship between the degree of crystal orientation and the electromechanical coupling coefficient in the case of AlN, and in the case of ZnO, ZnO—MgO, or the like, the relationship between the degree of crystal orientation and the electromechanical coupling coefficient is similar to that for AlN.

The $K^2$ value on the vertical axis indicates the energy conversion efficiency of electrical energy, which is determined for the piezoelectric film 10. The higher the energy conversion efficiency of electrical energy, the better the operating efficiency of the piezoelectric element with the piezoelectric film 10, and the piezoelectric element has excellent piezoelectric properties.

As illustrated in FIG. 3, when the FWHM is 5° or less in the relationship between the degree of crystal orientation and the $K^2$ value, the $K^2$ value becomes constant while increasing the energy conversion efficiency, resulting in a region of piezoelectric saturation. FIG. 3 indicates the relationship between the degree of crystal orientation and the electromechanical coupling coefficient in the case of AlN, but like AlN, ZnO, ZnO—MgO, or the like, which have a wurtzite crystal structure, indicate a similar relationship between the degree of crystal orientation and the electromechanical coupling coefficient. Therefore, in the present embodiment, crystalline orientation is considered favorable when the degree of crystalline orientation is 5° or less, where the piezoelectricity begins to saturate while increasing energy conversion efficiency.

The film density is preferably 5.1 g/cm 3 or less, more preferably 4.96 g/cm 3 or less, and more preferably 4.94 g/cm 3 or less. The lower limit of the film density can be determined as appropriate. If the film density is 5.1 g/cm 3 or less, the elements composing the piezoelectric film 10 can be suppressed from becoming dense and can be made into a so-called sparse state. Therefore, even if the c-axis orientation of the crystal is enhanced, the generation of stress generated in the piezoelectric film 10 can be suppressed and the increase in the film stress of the piezoelectric film 10 can be suppressed. Therefore, when the piezoelectric film 10 is applied to the piezoelectric element, the decrease of the piezoelectric properties of the piezoelectric element can be prevented.

The method of measuring the film density is not particularly limited, and for example, X-ray reflectometry (XRR) or the like can be used.

The degree of crystal orientation of the piezoelectric film 10 can be obtained from the peak intensity and FWHM of the rocking curve obtained by measuring the reflection from the (0002) plane of the crystal of ZnO contained as the piezoelectric material in the piezoelectric film 10 by the X-ray rocking curve method. The integrated value of the peak intensity divided by the FWHM can be used as the evaluation value of the degree of crystal orientation. The stronger the peak intensity of the rocking curve and the smaller the FWHM, the better the c-axis orientation of ZnO. Therefore, the larger the evaluated value of the integral of the peak intensity divided by the FWHM, the better the crystalline orientation (i.e., the lower the degree of crystalline orientation).

In addition, as described above, when the piezoelectric film 10 contains the wurtzite-type crystalline material as a main component and the wurtzite-type crystalline material contains Kr among Ar, Kr, Xe, and Rn as additive elements, the axial ratio c/a of the crystal structure contained in the piezoelectric material is preferably 1.59 or less, more preferably 1.585 or less, and even more preferably 1.582 or less. The wurtzite-type crystalline materials such as ZnO and the like have a hexagonal system and are randomly oriented with respect to the a-axis in the in-plane direction of the unit lattice of the wurtzite-type crystalline material. Since the wurtzite-type crystalline materials such as ZnO and the like extend to the a-axis in the in-plane direction, the stress in the crystal plane parallel to the substrate 11 can be equalized. If the axial ratio c/a is within the above preferred range, the piezoelectric material can equalize the stress distribution in the crystal plane, thus suppressing the increase in the film stress while retaining the c-axis orientation. On the other hand, the lower limit of the axial ratio c/a is not particularly limited, but is preferably 1.560 or more.

The axial ratio c/a of the crystal structure contained in the piezoelectric material is the ratio (ratio of c-axis to a-axis) of the c-axis length (lattice constant in the c-axis direction) to the a-axis length (lattice constant in the a-axis direction) in the unit lattice. In general, the axial ratio c/a can be controlled by controlling the amount of doping of other elements into the ZnO, lattice matching with the underlying material, temperature, pressure, or the like during the formation of the piezoelectric material. The axial ratio c/a of the crystal structure of the piezoelectric material can be evaluated by the in-plane X-ray diffraction method at room temperature.

The evaluation method of the film stress of the piezoelectric film 10 is not particularly limited as long as the film stress of the piezoelectric film 10 can be evaluated by various measurement methods. The film stress of the piezoelectric film 10 can be evaluated from, for example, the amount of warpage.

The amount of warpage of the piezoelectric film 10 can be determined by calculating the average height in the vertical direction between the surface where the piezoelectric film 10 is provided on the substrate 11 and each corner of the piezoelectric film 10 when the provided surface of the piezoelectric film 10 is on the bottom side. For example, if the piezoelectric film 10 is formed into a rectangle in plan view, the amount of warpage of the piezoelectric film 10 is the average of the heights in the vertical direction between the provided surface of the piezoelectric film 10 with the substrate 11 and the four corners of the piezoelectric film 10. If the amount of warpage is less than a predetermined value (e.g., 10 mm), the amount of warpage of the piezoelectric film 10 can be evaluated as favorable.

Next, an example of a method of producing the piezoelectric film 10 will be described. The piezoelectric film 10 is formed by sputtering the piezoelectric material containing ZnO on the substrate 11 and by taking Kr into the substrate 11, by a sputtering method using a target containing Zn such as ZnO or the like under a mixed gas atmosphere containing Kr and oxygen. As described later, Ar or the like may be used in addition to Kr as the mixed gas atmosphere containing oxygen, but when the mixed gas atmosphere contains Ar, Ar atoms enter the crystal lattice of wurtzite-type crystal materials such as ZnO or the like, and this causes the piezoelectric film to develop compressive stress, which causes increase in the film stress. When the mixed gas atmosphere contains Kr, Kr atoms enter the crystal lattice of the piezoelectric material, but are less likely to enter the crystal lattice of the wurtzite-type crystal materials than Ar atoms, and this prevents the development of compressive stress in the piezoelectric film 10. Therefore, by forming the piezoelectric film 10 in the mixed gas atmosphere containing Kr and oxygen by the sputtering method, the piezoelectric film 10 can be formed while suppressing the increase of its film stress.

In the mixed gas atmosphere containing Kr and oxygen, the ratio of the flow rate of oxygen to the total flow rate of Kr and oxygen is preferably in a range from 5% to 15%, and more preferably in a range from 7% to 12%. If the ratio of the flow rate of oxygen to the total flow rate of Kr and oxygen is within the above desirable range, the amount of Kr that enters into the crystal lattice of the wurtzite crystal materials such as ZnO or the like can be suppressed even if Kr atoms enter into the crystal lattice when the piezoelectric film 10 is formed by a sputtering method using a target containing Zn. Therefore, the increase in the film stress of the piezoelectric film 10 can be suppressed while the c-axis orientation of the piezoelectric material is kept high.

The pressure in the mixed gas atmosphere during sputtering is preferably in a range from 0.1 Pa to 2.0 Pa, and more preferably 0.5 Pa to 1.5 Pa. If the pressure is within the above preferred range, the amount of Kr atoms entering the crystal lattice of the wurtzite-type crystal materials such as ZnO or the like can be suppressed when the piezoelectric film 10 is formed by a sputtering method using a target containing Zn. Therefore, the increase in the film stress of the piezoelectric film 10 can be suppressed while the c-axis orientation of the piezoelectric material is kept high.

If the wurtzite-type crystalline material is ZnO and contains Kr as an additive element, a target of a ZnO sintered body can be used for the target. The target of the ZnO sintered body is placed in the sputtering system, and a mixed gas containing Kr and oxygen is supplied into the sputtering system. By sputtering with the target of the ZnO sintered body under the mixed gas atmosphere containing Kr and oxygen, the piezoelectric film 10 can be obtained on the substrate 11 while reducing the amount of Kr that enters into the crystal lattice of ZnO during ZnO deposition.

When the wurtzite-type crystalline material is a Mg-added ZnO thin film containing ZnO and MgO in a predetermined mass ratio, a multidimensional sputtering method using a target composed of a ZnO sintered body and a target composed of a MgO sintered body, or a one-dimensional sputtering method using an alloy target containing ZnO and MgO, such as a target of a ZnO sintered body with MgO added in a predetermined ratio, can be used.

When the multidimensional sputtering method is used, a multidimensional sputtering apparatus is used to supply a mixed gas containing Kr and oxygen into the multidimensional sputtering apparatus. By sputtering simultaneously and independently on the substrate 11 using the target of the ZnO sintered body and the target of the MgO sintered body under the mixed gas atmosphere containing Kr and oxygen, the Mg-added ZnO thin film can be formed on the substrate 11 while the amount of Kr entering during the formation of the Mg-added ZnO thin film is suppressed and the Kr content is kept within a desired range. This allows the piezoelectric film 10 composed of a Mg-added ZnO thin film with a Kr content of 0.01 atm % or more to be obtained.

When the one-dimensional sputtering method is used, the film can be formed on the substrate 11 so that Kr is contained in the Mg-added ZnO thin film at a desired ratio by sputtering under the mixed gas atmosphere containing Kr and oxygen, for example, using the target of the ZnO sintered body to which MgO is added in a predetermined ratio. Thus, the piezoelectric film 10 containing a desired amount of Kr in the Mg-added ZnO thin film can be obtained.

Thus, the piezoelectric film 10 according to the present embodiment has the piezoelectric material having the wurtzite-type crystal structure as a main component and contains Kr as an additive element. Then, the piezoelectric film 10 contains a kind of component selected from the group consisting of Zn, Al, Ga, Cd, and Si as an electropositive element in the piezoelectric material and the content of Kr element is in a range from 0.01 atm % to 0.05 atm %. When the content of Kr element contained in the piezoelectric material is within the above range in the piezoelectric film 10, the piezoelectric film 10 can enhance the c-axis orientation and have a high crystal orientation. Since the higher the crystal orientation of the piezoelectric material, the higher the energy conversion efficiency from electrical energy to mechanical energy can be, the larger the displacement of the piezoelectric film 10 in the thickness direction can be obtained. Moreover, the increase in the film stress can be suppressed in the piezoelectric film 10 by suppressing the Kr element contained in the piezoelectric material to the above content ratio. Therefore, the piezoelectric film 10 can have a large displacement in the thickness direction and can suppress the increase in the film stress, so that the piezoelectric film 10 can exhibit excellent piezoelectric properties and reduce the film stress. Therefore, the piezoelectric properties of the piezoelectric element can be improved by using the piezoelectric film 10 in the piezoelectric element.

For example, because Kr atoms are rare gases with larger atomic weight and atomic radius than Ar atoms, Kr atoms are harder to penetrate than Ar atoms when the piezoelectric film 10 is formed, and the content of Kr entering the wurtzite-type crystal material can be greatly reduced compared with Ar. Therefore, even if Kr atoms are contained in the piezoelectric film 10, the content is much less than Ar, so the film stress of the piezoelectric film 10 can be reduced. In addition, the crystal orientation can be improved because recoil components of the Kr atoms are small and oblique components of the sputtered particles reaching the substrate 11 can be reduced compared with the Ar atoms. Therefore, if the piezoelectric element is produced using the piezoelectric film 10, the piezoelectric element can have excellent piezoelectric properties and low film stress for a long time without providing an orientation control layer or an intermediate layer between the lower electrode and the piezoelectric layer for stress relaxation.

The piezoelectric film 10 has the piezoelectric material containing ZnO, and can have the crystal orientation of 5° or less and the film density of 5.1 g/cm 3 or less. As a result, the piezoelectric film 10 can have a high crystal orientation by enhancing the c-axis orientation of the piezoelectric material and can suppress the increase of film stress. Therefore, since the piezoelectric film 10 can have a large displacement in the thickness direction and suppress the increase of film stress, the piezoelectric film 10 can exhibit excellent piezoelectric properties and reduce the film stress.

The piezoelectric film 10 has the piezoelectric material containing ZnO and can reduce the axial ratio c/a of the crystal structure contained in the piezoelectric material to 1.59 or less. The piezoelectric material can extend the a-axis length of the unit lattice by containing an additive element such as Kr or the like. When the axial ratio c/a of the crystal structure contained in the piezoelectric material is 1.59 or less in the piezoelectric film 10, the piezoelectric material such as ZnO or the like can equalize the stress distribution in the crystal plane and thus reduce the compressive stress. Therefore, the piezoelectric film 10 can reduce the film stress more.

The piezoelectric film 10 can have a thickness of 100 nm to 3000 nm. This allows the piezoelectric film 10 to exhibit excellent piezoelectric properties and reduce the film stress while making the piezoelectric film 10 thin.

Since the piezoelectric film 10 has the above characteristics, the piezoelectric film 10 can be suitably used as a piezoelectric layer of a piezoelectric element.

<Piezoelectric Element>

A piezoelectric element equipped with a piezoelectric body according to the present embodiment will be described. The piezoelectric element according to the present embodiment is equipped with an electrode and a piezoelectric layer on a substrate, and the piezoelectric film 10 according to the present embodiment illustrated in FIG. 1 is used for the piezoelectric layer.

Figure 4:
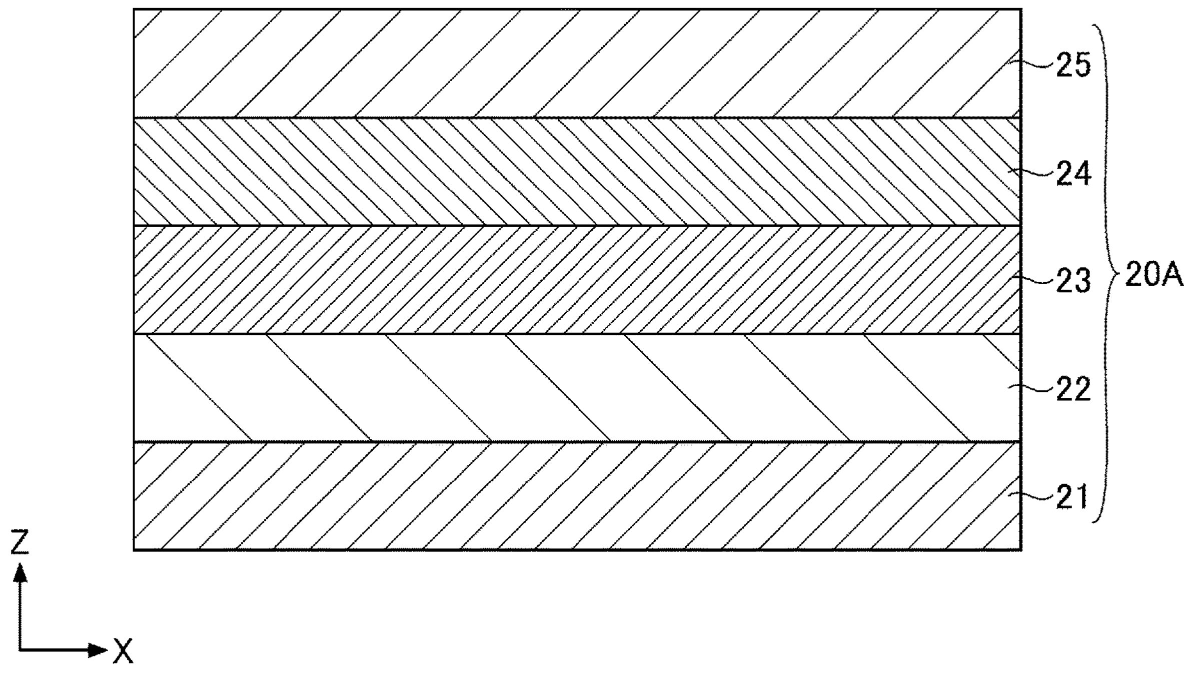
FIG. 4 is a schematic cross-sectional view illustrating a configuration of a piezoelectric element with a piezoelectric film according to an embodiment of the present invention.

FIG. 4 is a schematic cross-sectional view illustrating a configuration of the piezoelectric element. As illustrated in FIG. 4, a piezoelectric element 20A is composed of an orientation control layer 22, a first electrode 23, a piezoelectric layer 24, and a second electrode 25 laminated in this order on a substrate 21. The piezoelectric layer 24 is composed of the piezoelectric film 10 according to the present embodiment illustrated in FIG. 1. It should be noted that the piezoelectric element 20A may not have at least one of the orientation control layer 22 and the second electrode 25 depending on the application or the like.

Details of the substrate 21 are omitted because the substrate 11 on which the piezoelectric film 10 of the present embodiment illustrated in FIG. 1 can be used.

In the present embodiment, a placement position of the substrate 21 is not particularly limited, and the substrate 21 can be placed at an appropriate position according to the structure of the piezoelectric element 20A, the preparation process, or the like. For example, the substrate 21 may be placed between the orientation control layer 22 and the first electrode 23.

The orientation control layer 22 can be provided between the substrate 21 and the first electrode 23. The orientation control layer 22 has a function of adjusting the consistency of crystal growth between the substrate 21 and the piezoelectric layer 24 adjacent to each other in the laminate direction, and the piezoelectric layer 24 is formed by crystal growth close to epitaxial growth. Therefore, the piezoelectric layer 24 formed above the first electrode 23 can have favorable c-axis orientation even if its thickness is, for example, several hundred nm.

Furthermore, the orientation control layer 22 has excellent surface smoothness and has a function of improving the c-axis orientation of the piezoelectric layer 24 located above the orientation control layer 22. When the piezoelectric layer 24 contains ZnO, the c-axis of the piezoelectric layer 24 can be oriented in the vertical direction (laminate direction). In addition, the orientation control layer 22 has a high gas barrier property, and when a plastic substrate is used as the substrate 21, the influence of gas generated from the plastic substrate during film formation can be reduced. For example, when the orientation control layer 22 is formed using a thermosetting resin, the orientation control layer 22 is amorphous and has high smoothness. When the orientation control layer 22 is formed using a melamine resin, the barrier property can be enhanced because the orientation control layer 22 can have a higher density in the layer because the orientation control layer 22 has a three-dimensional cross-linked structure.

The orientation control layer 22 preferably contains amorphousness (amorphous). The orientation control layer 22 need not necessarily be 100% amorphous, but may have non-amorphous regions to the extent that the c-axis orientation of the piezoelectric layer 24 can be enhanced. When the proportion of the regions formed by the amorphous component in the region of the orientation control layer 22 is preferably 90% or higher, and more preferably 95% or higher, a sufficient control effect of the c-axis orientation can be obtained.

The orientation control layer 22 can be formed by an inorganic material, an organic material, or a mixture of an inorganic material and an organic material. Materials used for the inorganic material, the organic matter, and the mixture are not particularly limited as long as the materials improve the wettability of the substrate 21 and the first electrode 23 and improve the crystal orientation of the first electrode 23.

Examples of the inorganic materials include silicon oxide ($SiO_x$), silicon nitride (SiN), aluminum nitride (AlN), aluminum oxide ($Al_2O_3$), gallium nitride (GaN), and gallium oxide ($Ga_2O_3$); ZnO with $Al_2O_3$ and $SiO_x$ added (zinc oxide with aluminum and silicon addition (hereinafter, refers to "SAZO")); GaN, AlN, and ZnO with at least one of $Al_2O_3$, $Ga_2O_3$, $SiO_x$, and SiN added; Indium Tin Oxide (ITO); Indium Zinc Oxide (IZO); Indium Zinc Tin Oxide (IZTO); Indium Gallium Zinc Oxide (IGZO); and the like can be used.

Examples of the organic materials include acrylic resins, urethane resins, melamine resins, alkyd resins, siloxane polymers, and the like. In particular, a thermosetting resin composed of a mixture of a melamine resin, an alkyd resin, and an organosilane condensate as the organic materials is preferably used. Using the above materials, an amorphous film can be formed by a vacuum deposition method, a sputtering method (sputtering method), an ion plating method, a coating method, and the like.

The orientation control layer 22 may be a single layer or a laminate of two or more layers. When the orientation control layer 22 has two or more layers, an inorganic thin film and an organic thin film may be laminated.

The thickness of the orientation control layer 22 can be appropriately designed, for example, 3 nm to 100 nm is preferred, and 10 nm to 50 nm is more preferred. If the thickness of the orientation control layer 22 is within the above preferred range, the function as orientation controllability can be developed and the piezoelectric element can be thinner. Therefore, the crystal orientation of the piezoelectric layer 24 located above can be sufficiently improved and the crystallinity of the piezoelectric layer 24 can be improved.

The first electrode 23 is provided on the orientation control layer 22. Any material having conductivity can be used for the first electrode 23. When optical transparency is required, a transparent oxide conductive film such as ITO, IZO, IZTO, IGZO, or the like can be used as the material. When transparency is not essential, a good conductor such as a metal, for example, Au, Pt, Ag, Ti, Al, Mo, Ru, Cu, W, or the like can be used.

The film of the oxide conductor may be an amorphous film in order to suppress irregularities and grain boundaries at the interface between the first electrode 23 and the piezoelectric layer 24. By using the amorphous film, the surface irregularities of the first electrode 23 and the generation of grain boundaries that cause leakage paths can be suppressed. In addition, the upper piezoelectric layer 24 can grow with good crystal orientation without being affected by the crystal orientation of the first electrode 23.

The first electrode 23 may be formed in a thin film shape on a part or the entire surface of the orientation control layer 22, or the first electrode 23 may be provided in multiple parallel stripes.

The second electrode 25 can be provided on the piezoelectric layer 24. The second electrode 25 can be formed of any material having conductivity. When the piezoelectric element 20A requires light transmission, a transparent oxide conductive film such as ITO, IZO, IZTO, IGZO, or the like may be used. When light transmission is not essential, a metal electrode of a good conductor such as Au, Pt, Ag, Ti, Al, Mo, Ru, Cu, W, or the like may be used.

The second electrode 25 may be formed in a thin film on a part or the entire surface of the piezoelectric layer 24, or the second electrode 25 may be provided in multiple parallel stripes.

An example of a method of producing the piezoelectric element 20A will be described.

The orientation control layer 22 is formed on the surface of the substrate 21. An IZO film or the like can be used as the orientation control layer 22. For example, a sputtering method at room temperature or the like can be used for forming the orientation control layer 22. The deposition temperature of the orientation control layer 22 need not be at room temperature as long as the amorphous structure can be maintained, and the film may be deposited at a substrate temperature of, for example, 150° C. or lower.

Next, the first electrode 23 is formed above the orientation control layer 22. For the first electrode 23, for example, an ITO film, a Ti film, or the like formed by magnetron sputtering of direct current (DC) or high frequency (RF) can be used.

Depending on the embodiments of the piezoelectric element 20A, the first electrode 23 may be used as a solid electrode or the first electrode 23 may be processed into a predetermined shape pattern by etching or the like. When the piezoelectric element 20A is used as a pressure sensor in a touch panel or the like, the first electrode 23 may be arranged in a plurality of stripes.

Then, the piezoelectric layer 24 is formed on the first electrode 23. For example, a target containing Zn and Mg is used to form a film by RF magnetron sputtering under a mixed gas atmosphere containing Kr and a trace amount of oxygen. At this time, the ratio of the flow rate of oxygen to the total flow rate of Kr and oxygen is preferably in a range from 5% to 15%, and the pressure in the mixed gas atmosphere during sputtering is preferably in a range from 0.1 Pa to 2.0 Pa. This enables the formation of the piezoelectric layer 24 containing ZnO and MgO while suppressing the amount of Kr entering the crystal structure of ZnO and MgO, and with a Kr content of 0.01 atm % to 0.05 atm %. In addition, as a method of forming the piezoelectric layer 24, a MgZnO target containing a predetermined percentage of Mg in Zn may be used for sputtering under a mixed gas atmosphere containing Kr and a trace amount of oxygen. In addition, as another method of forming the piezoelectric layer 24, a ZnO target and an MgO target may be simultaneously and independently sputtered in the mixed gas atmosphere containing Kr and a trace amount of oxygen using a multi-component sputtering apparatus.

The piezoelectric layer 24 may be formed by laminating multiple layers.

The deposition temperature of the piezoelectric layer 24 need not be at room temperature as long as the amorphous structure of the orientation control layer 22 located below the piezoelectric layer 24 is maintained. For example, the piezoelectric layer 24 may be deposited at a substrate temperature of 150° C. or lower.

By using the sputtering method for the deposition of the orientation control layer 22, the first electrode 23, and the piezoelectric layer 24, a uniform film with a strong adhesive force can be formed while the composition ratio of the compound target is kept approximately. In addition, the orientation control layer 22, the first electrode 23, and the piezoelectric layer 24 with a desired thickness can be precisely formed only by controlling the time.

Next, the second electrode 25 with a predetermined shape is formed on the piezoelectric layer 24. As the second electrode 25, an ITO film with a thickness of 20 nm to 100 nm is formed at room temperature, for example, by DC or RF magnetron sputtering. The second electrode 25 may be formed on the entire surface of the piezoelectric layer 24, or may be formed in any shape as appropriate. For example, if the first electrode 23 is patterned in a stripe shape, the second electrode 25 may be formed in such a way that multiple stripes extend in a direction perpendicular to the direction in which the stripes of the first electrode 23 extend in a plan view.

Thus, the piezoelectric element 20A is obtained.

After the formation of the second electrode 25, the entire piezoelectric element 20A may be heat-treated at a temperature lower than the melting point or the glass transition point of the substrate 21 (for example, 130° C.). By this heat treatment, the first electrode 23 and the second electrode 25 can be crystallized and the electrodes can be made to have a low resistance. The heat treatment is not essential and may not be performed after the formation of the piezoelectric element 20A in the case that the substrate 21 is formed of a material that is not heat-resistant.

Thus, the piezoelectric element 20A has the piezoelectric layer 24 between the first electrode 23 and the second electrode 25, and the piezoelectric layer 24 can exhibit excellent piezoelectric properties and reduce the film stress, so the piezoelectric element 20A can exhibit high piezoelectric efficiency in the thickness direction of the piezoelectric layer 24 and can certainly exhibit excellent piezoelectric properties.

The piezoelectric properties of the piezoelectric element 20A can be evaluated by $d_{33}$ value. The $d_{33}$ value represents the stretching mode of the piezoelectric layer 24 in the thickness direction and is the amount of polarized charge per unit pressure applied in the thickness direction [C/N] of the piezoelectric layer 24. The $d_{33}$ value is also referred to as a piezoelectric constant. The higher the $d_{33}$ value, the better the polarization of the piezoelectric layer 24 provided in the piezoelectric element 20A in the thickness direction (c-axis direction).

The $d_{33}$ value can be directly measured using a piezoelectric constant measuring device (LPF-02, manufactured by Lead Techno Co., Ltd.) or the like. The upper and lower surfaces of the piezoelectric layer 24 are sandwiched between the electrodes of the piezoelectric constant measuring device, and an indenter is pressed against the surface of the piezoelectric layer 24 to apply a low-frequency load to the piezoelectric layer 24, and the amount of generated charge is measured with a Coulombmeter of the piezoelectric constant measuring device. The measured amount of charge divided by the load is output as the $d_{33}$ value. The larger the absolute $d_{33}$ value, the better the piezoelectric properties in the thickness direction of the piezoelectric layer 24.

The piezoelectric element 20A can be suitably used for piezoelectric devices because the piezoelectric element 20A has excellent piezoelectric properties. The piezoelectric devices include, for example, a device using a piezoelectric effect such as a force sensor for a touch panel, a pressure sensor, an acceleration sensor, an acoustic emission (AE) sensor, and the like, a speaker using a reverse piezoelectric effect, a transducer, a high-frequency filter device, a piezoelectric actuator, an optical scanner, and the like.

(Other Embodiments)

In the present embodiment, the piezoelectric element 20A is not limited to the above configuration, but may have other configurations as long as the piezoelectric element 20A has a first electrode 23 and a piezoelectric layer 24 on a substrate 21, and the piezoelectric layer 24 can exhibit excellent piezoelectric properties in the thickness direction. An example of other configurations of the piezoelectric element 20A is indicated below.

Figure 5:
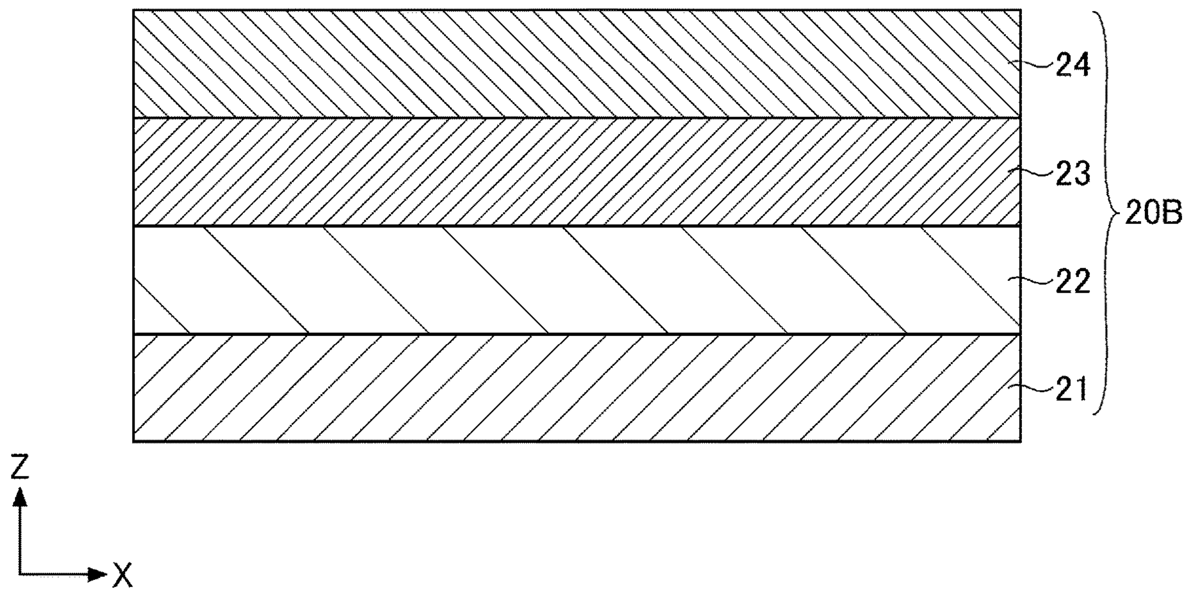
FIG. 5 is a schematic cross-sectional view illustrating an example of another configuration of a piezoelectric element.

As illustrated in FIG. 5, a piezoelectric element 20B need not have a second electrode 25.

Figure 6:
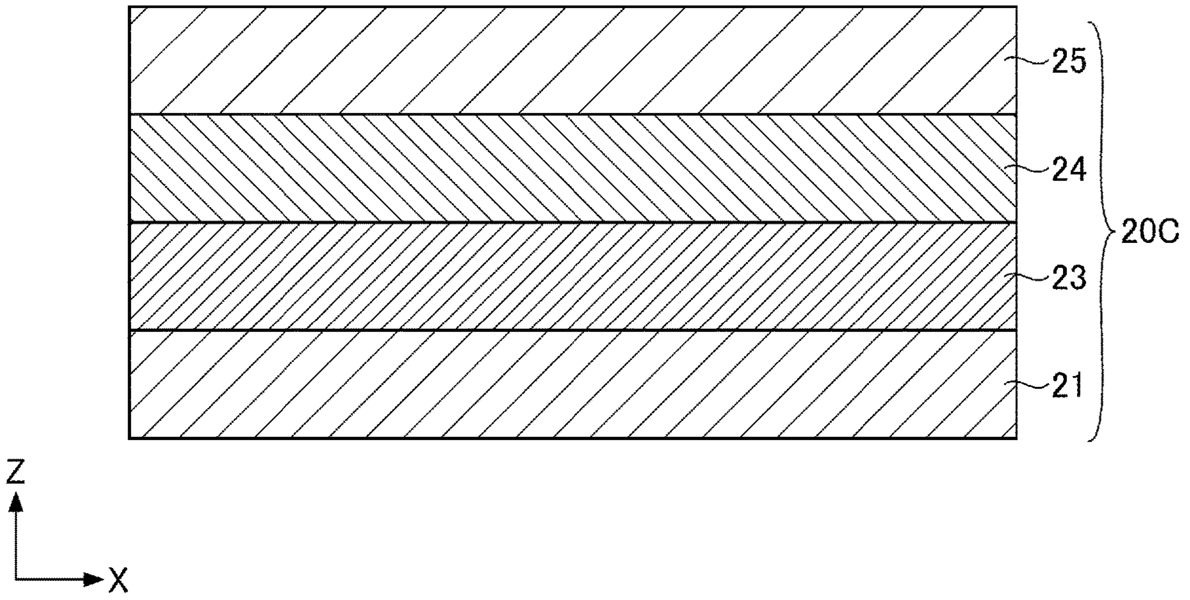
FIG. 6 is a schematic cross-sectional view illustrating an example of another configuration of a piezoelectric element.

As illustrated in FIG. 6, a piezoelectric element 20C need not have an orientation control layer 22.

Figure 7:
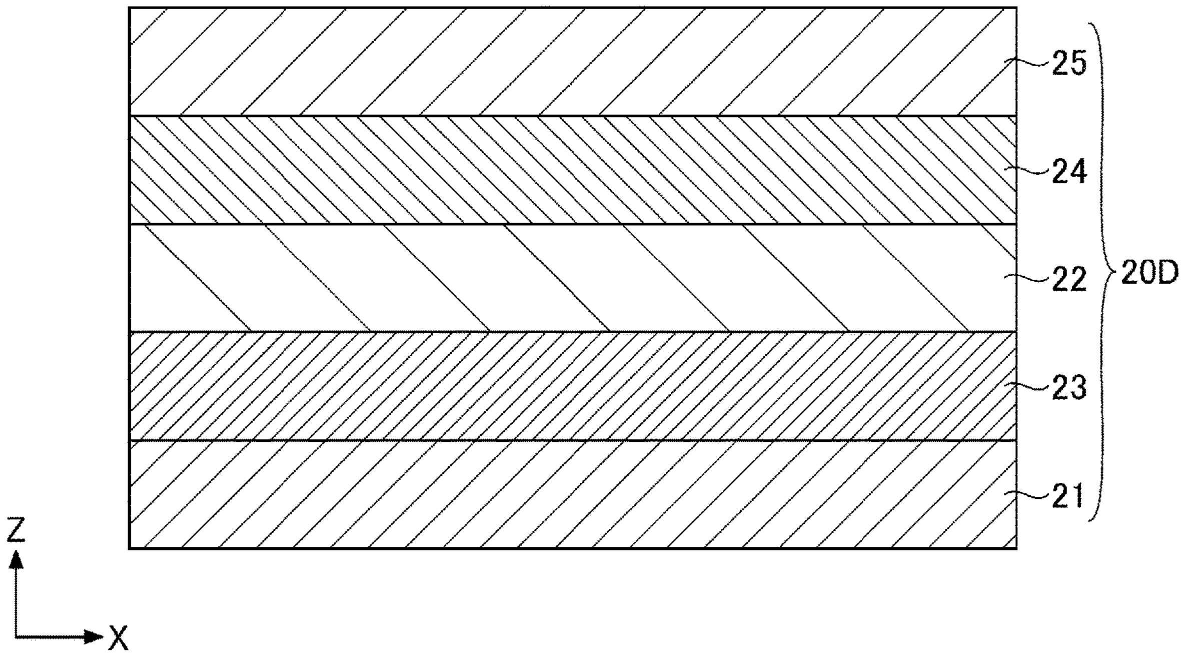
FIG. 7 is a schematic cross-sectional view illustrating an example of another configuration of a piezoelectric element.

As illustrated in FIG. 7, a piezoelectric element 20D may have the orientation control layer 22 between the first electrode 23 and the piezoelectric layer 24.

Figure 8:
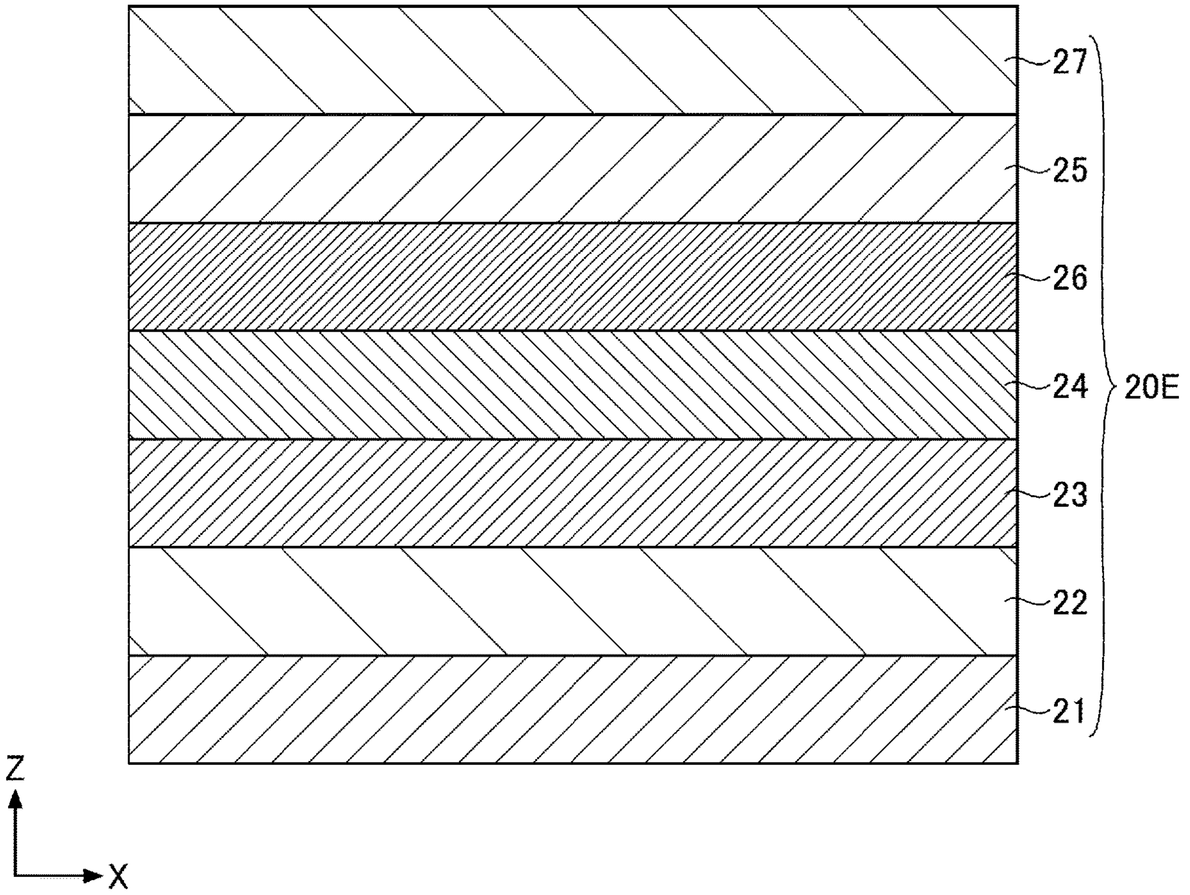
FIG. 8 is a schematic cross-sectional view illustrating an example of another configuration of a piezoelectric element.

As illustrated in FIG. 8, a piezoelectric element 20E may have an adhesive layer 26 between the piezoelectric layer 24 and the second electrode 25 and a substrate 27 on the top surface of the second electrode 25.

The adhesive layer 26 suppresses leakage paths caused by cracks and pinholes in the piezoelectric layer 24. If a metal grain boundary or protrusion exists at the interface between the first electrode 23 and the piezoelectric layer 24 or between the piezoelectric layer 24 and the second electrode 25, when cracks or the like occur at either the first electrode 23, the piezoelectric layer 24 or the second electrode 25, a leakage path is formed between the first electrode 23 and the second electrode 25 due to cracks or the like, and polarization disappears. By providing the adhesive layer 26 between the piezoelectric layer 24 and the second electrode 25, the piezoelectric element 20E suppresses the formation of the leakage path and maintains the piezoelectric properties of the piezoelectric layer 24 well.

The substrate 27 can use the same material as the substrate 21.

An example of a method of producing the piezoelectric element 20E will be described. For example, a first laminate is formed by laminating the orientation control layer 22, the first electrode 23 and the piezoelectric layer 24 in this order on the substrate 21. On the other hand, a second laminate is formed by forming the second electrode 25 on the substrate 27. Then, the piezoelectric layer 24 and the second electrode 25 are bonded together through the adhesive layer 26 so that the piezoelectric layer 24 of the first laminate and the second electrode 25 of the second laminate face each other. Thus, the piezoelectric element 20E is produced.

The piezoelectric element 20E can have excellent piezoelectric properties because the electromechanical coupling coefficient in the thickness vibration mode is large and the leak path between the electrodes can be suppressed.

EXAMPLES

Embodiments will be described more specifically below with Examples and Comparative Examples, but embodiments are not limited by these Examples and Comparative Examples.

<Preparation of Piezoelectric Element>

[Example 1] (Preparation of Orientation Control Layer)

An amorphous IZO film was deposited on a substrate (PET, thickness: 50 μm) under a mixed gas atmosphere of Ar and $O_2$ using the DC sputtering method so that the thickness of the amorphous IZO film was adjusted to 50 nm. On top of the amorphous IZO film, a Mg-added ZnO thin film with a hexagonal wurtzite-type structure was formed with a thickness of 30 nm in a sputtering target under a mixed gas atmosphere of Ar and $O_2$ using the DC sputtering method with the mass ratio of ZnO and MgO adjusted to 88 wt %:12 wt %. Thus, the Mg-added ZnO thin film was formed on the IZO film. The overall thickness of the orientation control layer was 80 nm.

(Preparation of First Electrode)

On top of the orientation control layer, a hexagonal metal layer, which is a Ti film with a thickness of 30 nm, was deposited as the first electrode using the DC magnetron sputtering method under a mixed gas atmosphere of Ar and $O_2$.

(Preparation of Piezoelectric Layer)

A Mg-added ZnO thin film with hexagonal wurtzite-type structure was deposited as a piezoelectric layer on the first electrode under a mixed gas atmosphere of Kr and $O_2$ with a gas pressure adjusted to 0.7 Pa and a mass ratio of ZnO and MgO adjusted to 88 wt %:12 wt % using the DC sputtering method. The thickness of the piezoelectric layer was 500 nm.

In this way, the piezoelectric element was prepared by laminating the orientation control layer, the first electrode, and the piezoelectric layer in this order on the substrate.

A sample similar to the piezoelectric layer prepared in the process of preparing the piezoelectric element was prepared. The type of additive elements contained in the piezoelectric layer samples, the ratio of the content (Kr elements/contained elements), which is the ratio of the content of Kr elements to the content of contained elements in the piezoelectric material, the crystal orientation, film density, axial ratio c/a, and amount of warpage of the piezoelectric layer were measured. The results of these measurements are indicated in Table 1.

(Ratio of Kr Content in Piezoelectric Layer)

The ratio of the content of Kr (Kr element/contained elements) in the prepared samples was evaluated by Rutherford backscattering spectrometry (RBS) using Pelletron 3SDH and 5SDH-2 (manufactured by NEC) based on the following measurement conditions and evaluation criteria. The contained elements refer to ZnO and MgO. The detection limit of the content of Kr in the sample piezoelectric layer was 0.01 atm %.

((Measurement Conditions))

Incident ion: $4He^{++}$
Incident energy: 2300 keV
Incident angle: 0 deg
Scattering angle: 140 deg
Sample current: 10 nA
Beam diameter: 2 mmφ
In-plane rotation: No
Amount of Radiation: 80 μC (Degree of Crystal Orientation)

The surface of the prepared sample was measured by the XRC method using an X-ray diffractometer (SmartLab, manufactured by Rigaku) under the following measurement conditions. The full width at half maximum (FWHM) of the peak waveform of the rocking curve obtained by measuring the reflection from the (0002) plane of the main component crystal in the sample was determined as the degree of the crystal orientation of the piezoelectric layer.

((Measurement Conditions))

Measurement mode: ω scan
Scan range: 0° to 34.2°
Step width: 0.1°
Speed/counting time: 4°/min
Incident slit: 1.0 mm
Incident and Receiving Solar slit: 5°
Longitudinal limiting slit: 10 mm
Photodetector: PSA Open (Film Density)

The film density of the prepared sample was measured by X-ray reflectometry using an X-ray diffractometer (SmartLab, manufactured by Rigaku) under the following measurement conditions to determine the film density of the piezoelectric layer.

((Measurement Conditions))

Measuring range: 0.2° to 8.0°
Measuring interval: 0.01°
Speed/counting time: 0.5°/min
Divergent slit: 0.05 mm (Axial Ratio c/a)

Figure 9:
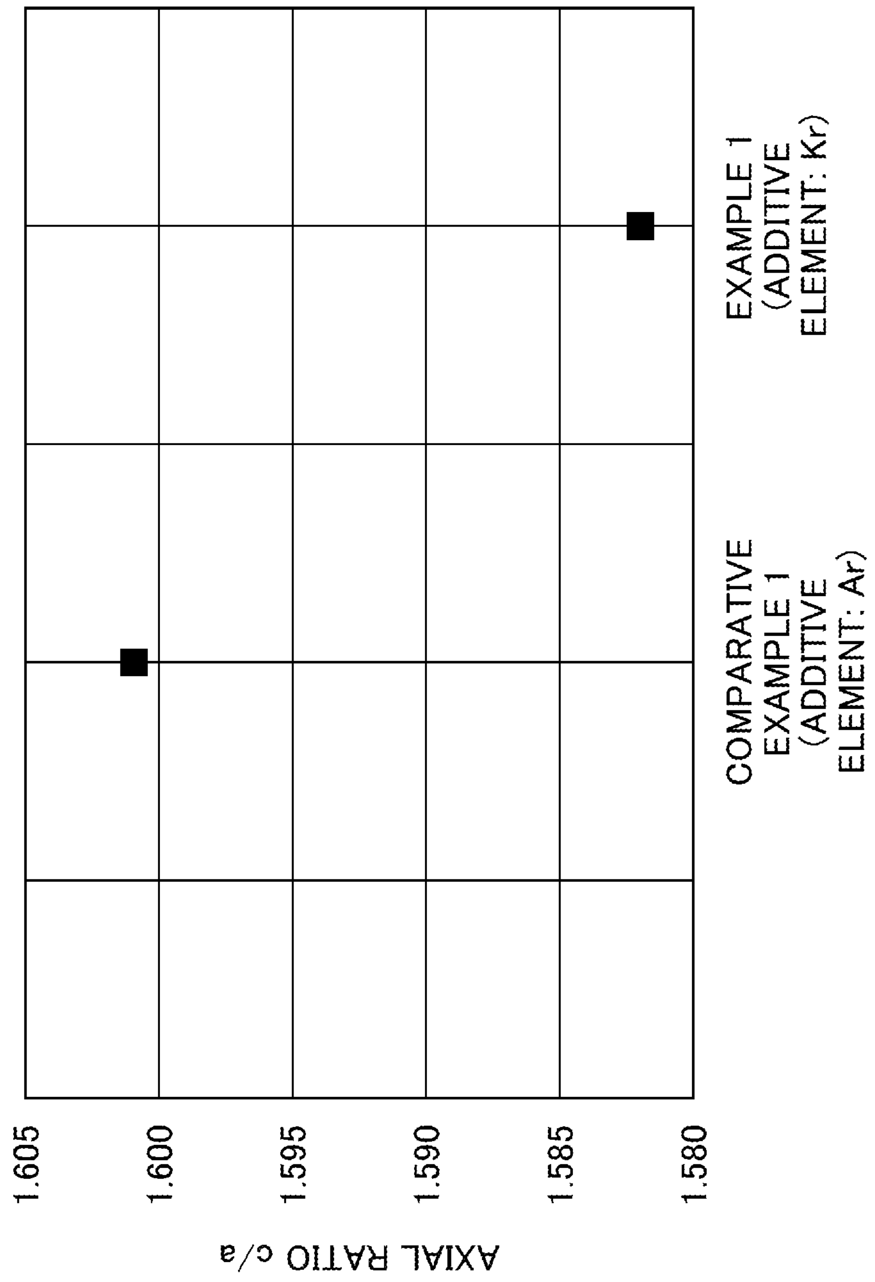
FIG. 9 is a diagram illustrating a measurement result of an axial ratio c/a of the piezoelectric elements in Example 1 and Comparative Example 1.

The prepared samples were analyzed for the a-axis length and c-axis length of the crystal lattice by the in-plane X-ray diffraction method with 2θχ/φ scan using an X-ray diffractometer (SmartLab, manufactured by Rigaku) under the following measurement and analysis conditions, and the axial ratio c/a of the crystal lattice was obtained. When the axial ratio c/a was less than 1.590, it was evaluated as good, and when the axial ratio c/a exceeded 1.590, it was evaluated as poor. The measurement results of the axial ratio c/a are indicated in FIG. 9.

((Measurement Conditions))

Scanning axis: 2θχ/φ Scan

Incidence angle: 0.3°

Scan range: 5° to 110°

Step: 0.1°

Scan speed: 2.0°/min (Analysis Method)

Fitting was performed using diffraction peaks obtained using SmartLab analysis software (SmartLab StudioII) for X-ray diffractometer, and analysis was performed using ZnO (database number 1011258) using crystal structure database COD to calculate the a-axis length and the c-axis length.

(Amount of Warpage)

The prepared sample was cut into 3 cm squares and placed on a reference plane with the plane on which the piezoelectric layer was formed on the underside, and the average height in the vertical direction between the reference plane and each corner of the sample was calculated to determine the amount of warpage of the piezoelectric layer. Film warpage was evaluated as good if the amount of warpage was 10 mm or less.

<Evaluation of Piezoelectric Element>

The piezoelectric properties of the prepared piezoelectric element were evaluated.

(Piezoelectric Properties)

Lattice distortion was generated in the piezoelectric layer by placing the piezoelectric element on the stage and drawing the first electrode on the stage, and applying an indenter located at the top of the piezoelectric element at a set pressure, and the generated charge due to polarization in the film thickness direction derived from the lattice distortion was evaluated. The pressure difference from the initial pressure was varied from 1 N to 9 N, and the value of the generated charge divided by the applied pressure was calculated and evaluated as the piezoelectric property.

The piezoelectric properties were evaluated with $d_{33}$ value. Using a piezometer PM300 (manufactured by Piezotest), the $d_{33}$ value of the piezoelectric layer was directly measured. The $d_{33}$ value represents the stretching mode of the piezoelectric element in the thickness direction and is the amount of polarized charge per unit pressure applied in the thickness direction [C/N] of the piezoelectric layer. The higher the $d_{33}$ value, the better the polarization of the piezoelectric layer in the thickness direction (c-axis direction) and the higher the piezoelectric element can be evaluated as having high piezoelectric properties. The measurement result of the $d_{33}$ value, which indicates the piezoelectric properties of the piezoelectric element, is indicated in Table 1.

From the measurement results of the prepared samples, it can be said that the obtained piezoelectric layer had good crystal orientation, since the degree of crystal orientation was 2.5°, which is less than 5° where energy conversion efficiency can be increased as a piezoelectric element, even though the thickness was 500 nm. The film density was 4.94 g/cm 3, which is less than 5.1 g/cm 3 that increases the film stress of the piezoelectric layer. Therefore, it was confirmed that the film density is good. Furthermore, the axial ratio c/a was 1.582, which is less than 1.590. The lattice constant of the crystal of the main component constituting the piezoelectric layer has a longer a-axis than c-axis, and the stress on the crystal plane tends to be equalized in the direction parallel to the substrate. Therefore, it was confirmed that the axial ratio c/a is good. The piezoelectric property of the $d_{33}$ value indicating the piezoelectricity of the piezoelectric material was 12.7 pC/N. In addition, since the amount of warpage of the piezoelectric layer was 4.5 mm, it was confirmed that the warpage of the piezoelectric layer was kept low. Therefore, it was confirmed that the suppression of film stress of the piezoelectric layer was compatible with good crystal orientation.

Example 2

The piezoelectric element was prepared in the same manner as in Example 1 except that the thickness of the piezoelectric layer was changed to 1000 nm. The measurement results of the contained ratio of Kr element in the piezoelectric layer, the thickness, the degree of crystal orientation, the film density, the axial ratio c/a, and the amount of warpage of the piezoelectric layer; and piezoelectric properties ($d_{33}$ value) of the piezoelectric element are indicated in Table 1.

As indicated in Table 1, even if the thickness of the obtained piezoelectric layer was 1000 nm, FWHM was 2.4°, which is 5.0° or less, where energy conversion efficiency can be increased as a piezoelectric element, indicating that the crystal orientation is confirmed to be good. The $d_{33}$ value of the piezoelectric property indicating piezoelectricity of the piezoelectric material was 11.2 pC/N. In addition, since the amount of warpage of the piezoelectric layer was 6.1 mm, it can be said that the warpage of the piezoelectric layer was suppressed low. Therefore, it was confirmed that even for the piezoelectric element having the piezoelectric layer with a thickness of 1000 nm, the suppression of film stress in the piezoelectric layer is compatible with good crystal orientation.

Example 3

The piezoelectric element was prepared in the same manner as in Example 1 except that the deposition gas pressure of the piezoelectric layer was changed from 0.7 Pa to 1.6 Pa. The measurement results of the contained ratio of Kr element in the piezoelectric layer, the thickness, the degree of crystal orientation, the film density, the axial ratio c/a, and the amount of warpage of the piezoelectric layer; and piezoelectric properties ($d_{33}$ value) of the piezoelectric element are indicated in Table 1.

As indicated in Table 1, even if the deposited gas pressure of the obtained piezoelectric layer was 1.6 Pa, FWHM was 3.6°, which is 5.0° or less, where energy conversion efficiency can be increased as a piezoelectric element, indicating that the degree of crystal orientation is good. The $d_{33}$ value of the piezoelectric property indicating piezoelectricity of the piezoelectric material was 9.2 pC/N. In addition, since the amount of warpage of the piezoelectric layer was 3.8 mm, it can be said that the warpage of the piezoelectric layer was suppressed low. Therefore, it was confirmed that even for the piezoelectric element formed at a deposition gas pressure of 1.6 Pa, the suppression of film stress in the piezoelectric layer is compatible with a good degree of crystal orientation.

Comparative Example 1

The piezoelectric element was prepared in the same manner as in Example 1 except that the preparation of the piezoelectric layer was changed as follows.

(Preparation of Piezoelectric Layer)

A Mg-added ZnO thin film with a hexagonal wurtzite-type structure was deposited as a piezoelectric layer on the first electrode under a mixed gas atmosphere of Ar and $O_2$, with the gas pressure adjusted to 0.2 Pa and the mass ratio of ZnO and MgO adjusted to 88 wt %:12 wt % using the DC sputtering method.

The measurement results of the contained ratio of Kr element in the piezoelectric layer, the thickness, the degree of crystal orientation, the film density, the axial ratio c/a, and the amount of warpage of the piezoelectric layer; and piezoelectric properties ($d_{33}$ value) of the piezoelectric element are indicated in Table 1. In addition, the measurement result of the axial ratio c/a is indicated in FIG. 9. As indicated in Table 1, even if the thickness of the obtained piezoelectric layer was 500 nm, FWHM was 2.5°, which is 5.0° or less, where energy conversion efficiency can be increased as a piezoelectric element, indicating that the degree of crystal orientation is conformed good. In addition, the axial ratio c/a was 1.601, which exceeds 1.590. The lattice constant of the crystal of the main component constituting the piezoelectric layer has a shorter a-axis than c-axis, and it is difficult to equalize the stress on the crystalline plane in the direction parallel to the substrate. Therefore, it was confirmed that the axial ratio c/a is poor. The $d_{33}$ value of the piezoelectric property indicating piezoelectricity of the piezoelectric material was 11.8 pC/N. In addition, with regards to the amount of warpage of the piezoelectric layer, when the sample was placed statically on the reference surface with the piezoelectric layer formed on the bottom side, the sample became cylindrical. Therefore, the film stress was confirmed extremely large, and the measurement was not performed.

Comparative Example 2

The piezoelectric element was prepared in the same manner as in Comparative Example 1 except that the gas pressure was changed from 0.2 Pa to 0.7 Pa when the piezoelectric layer was prepared.

The measurement results of the contained ratio of Kr element in the piezoelectric layer, the thickness, the degree of crystal orientation, the film density, the axial ratio c/a, and the amount of warpage of the piezoelectric layer; and piezoelectric properties ($d_{33}$ value) of the piezoelectric element are indicated in Table 1. As indicated in Table 1, in Comparative Example 2, even if the thickness of the obtained piezoelectric layer was 500 nm, FWHM was 2.4°, which was 5.0° or less, where energy conversion efficiency can be increased as a piezoelectric element, indicating that the degree of crystal orientation was conformed to be good. In addition, the axial ratio c/a was 1.601, which exceeded 1.590. The lattice constant of the crystal of the main component constituting the piezoelectric layer has a shorter a-axis than c-axis, and it is difficult to equalize the stress on the crystalline plane in the direction parallel to the substrate. Therefore, it was confirmed that the axial ratio c/a was poor. The d 33 value of the piezoelectric property indicating piezoelectricity of the piezoelectric material was 10.5 pC/N. In addition, with regards to the amount of warpage of the piezoelectric layer, when the sample was placed statically on the reference surface with the piezoelectric layer formed on the bottom side, the sample became cylindrical. Therefore, the film stress was confirmed extremely large, and the measurement was not performed.

Comparative Example 3

The piezoelectric element was prepared in the same manner as in Comparative Example 1 except that the gas pressure was changed from 0.2 Pa to 3.0 Pa when the piezoelectric layer was prepared.

The measurement results of the contained ratio of Kr element in the piezoelectric layer, the thickness, the degree of crystal orientation, the film density, the axial ratio c/a, and the amount of warpage of the piezoelectric layer; and piezoelectric properties ($d_{33}$ value) of the piezoelectric element are indicated in Table 1. As indicated in Table 1, in Comparative Example 3, even if the thickness of the obtained piezoelectric layer was 500 nm, FWHM was 5.4°, which exceeds 5.0° or less, where the degree of crystal orientation of the obtained piezoelectric layer was confirmed to be poor. In addition, the axial ratio c/a was 1.603, which exceeds 1.590. The lattice constant of the crystal of the main component constituting the piezoelectric layer has a shorter a-axis than c-axis, and it is difficult to equalize the stress on the crystalline plane in the direction parallel to the substrate. Therefore, it was confirmed that the axial ratio c/a was poor. The d 33 value of the piezoelectric property indicating piezoelectricity of the piezoelectric material was 6.5 pC/N. In addition, with regards to the amount of warpage of the piezoelectric layer, the amount of warpage was 22.4 mm, which exceeded 10 mm; thus, it was confirmed that the film stress was large and the amount of warpage was evaluated as poor.

Comparative Example 4

The piezoelectric element was prepared in the same manner as in Example 1 except that the gas pressure was changed from 0.7 Pa to 0.2 Pa when the piezoelectric layer was prepared.

The measurement results of the contained ratio of Kr element in the piezoelectric layer, the thickness, the degree of crystal orientation, the film density, the axial ratio c/a, and the amount of warpage of the piezoelectric layer; and piezoelectric properties ($d_{33}$ value) of the piezoelectric element are indicated in Table 1. As indicated in Table 1, in Comparative Example 4, since the content of Kr in the piezoelectric layer was below the lower limit of detection (0.01 atm %), it was confirmed that the content of Kr was less than 0.01 atm %. Even if the thickness of the obtained piezoelectric layer in Comparative Example 4 was 500 nm, FWHM was 2.4°, which was 5.0° or less, where energy conversion efficiency can be increased as a piezoelectric element, indicating that the degree of crystal orientation was conformed to be good. The $d_{33}$ value of the piezoelectric property indicating piezoelectricity of the piezoelectric material was 12.1 pC/N. However, the content of Kr in the piezoelectric layer was below 0.01 atm %, which was below the lower limit of detection, and the amount of warpage of the piezoelectric layer was large and the warpage was not suppressed. This may be due to the following reasons. In general, when the gas pressure is low, the amount of Ar atoms present in the piezoelectric layer tends to be low, resulting in lower Ar atom uptake into the piezoelectric layer and higher film density, which leads to higher compressive stress. In the similar manner as Kr gas, the film stress in the piezoelectric layer may be very high because the amount of sputter gas atoms taken up in the low gas pressure region tends to be low and the film density is high.

TABLE 1

| | Piezoelectric layer | | | | | | | Piezoelectric element |
|---|---|---|---|---|---|---|---|---|
| | Kr element | | | Degree | | | | Piezoelectric |
| | Types | Contained ratio (Kr element/Contained elements) [atm %] | Thickness [nm] | of crystal orientation [°] | Film density [g/cm$^3$] | Axial ratio c/a | Amount of warpage [nm] | property (value of $d_{33}$) [pC/N] |
| Example 1 | Kr | 0.02 | 500 | 2.5 | 4.94 | 1.582 | 4.5 | 12.7 |
| Example 2 | Kr | 0.02 | 1000 | 2.4 | 4.94 | 1.582 | 6.1 | 11.2 |
| Example 3 | Kr | 0.03 | 500 | 3.6 | 4.9 | 1.579 | 3.8 | 9.2 |
| Comparative Example 1 | Ar | 0 | 500 | 2.5 | 5.1 | 1.601 | Large (unable to measure) | 11.8 |
| Comparative Example 2 | Ar | 0 | 500 | 2.4 | 5.04 | 1.601 | Large (unable to measure) | 10.5 |
| Comparative Example 3 | Ar | 0 | 500 | 5.4 | 4.99 | 1.603 | 22.4 | 6.5 |
| Comparative Example 4 | Kr | <0.01 | 500 | 2.4 | 5.04 | 1.596 | Large (unable to measure) | 12.1 |

As described above, the above embodiment is presented as an example, and the invention is not limited by the above embodiment. The above embodiment can be carried out in various other forms, and various combinations, omissions, replacements, modifications and the like can be made without departing from the gist of the invention. These embodiments and variations thereof are included in the scope and gist of the invention, and are equally within the scope of the invention described in the claims.

DESCRIPTION OF THE REFERENCE NUMERALS

10 Piezoelectric film
11, 21, 27 Substrates
20 A, 20B, 20 C, 20D, 20E Piezoelectric elements
22 Orientation control layer
23 First electrode
24 Piezoelectric layer
25 Second electrode
26 Adhesive layer

The invention claimed is:

1. A piezoelectric film comprising:

a piezoelectric material having a wurtzite-type crystal structure as a main component; and an additive element including Kr, wherein the piezoelectric material contains a component selected from the group consisting of Zn, Al, Ga, Cd, and Si, as an electropositive element, and wherein a ratio of a content of Kr element to a content of contained elements in the piezoelectric material is in a range from 0.01 atm % to 0.05 atm %.

2. The piezoelectric film according to claim 1, wherein the piezoelectric material contains ZnO, and wherein a degree of a crystal orientation is 5° or less and a film density is 5.1 g/cm$^3$ or less.

3. The piezoelectric film according to claim 1, wherein the piezoelectric material contains ZnO, and wherein an axial ratio c/a of the crystal structure contained in the piezoelectric material is 1.59 or less.

4. The piezoelectric film according to claim 1, wherein a thickness of the piezoelectric film is in a range from 100 nm to 3000 nm.

5. A method of producing the piezoelectric film according to claim 1, wherein the piezoelectric film is formed by sputtering the piezoelectric material on a substrate and by taking Kr into the substrate, by a sputtering method using a target containing Zn under a mixed gas atmosphere containing Kr and oxygen.

6. The method of producing the piezoelectric film according to claim 5, wherein the sputtering method is a multidimensional sputtering method using a target formed of ZnO and a target formed of MgO, or a one-dimensional sputtering method using a target formed of an alloy of ZnO and MgO.

7. A piezoelectric element comprising an electrode and a piezoelectric layer over a substrate, wherein the piezoelectric layer is the piezoelectric film according to claim 1.

8. A piezoelectric device comprising the piezoelectric element according to claim 7.

* * * * *